United States Patent [19]

Saucier et al.

[11] Patent Number: 5,359,537
[45] Date of Patent: Oct. 25, 1994

[54] AUTOMATIC SYNTHESIS OF INTEGRATED CIRCUITS EMPLOYING CONTROLLED INPUT DEPENDENCY DURING A DECOMPOSITION PROCESS

[75] Inventors: Gabriele Saucier, Bresson; Franck J. Poirot, Valbonne, both of France

[73] Assignee: VLSI Technology, Inc., San Jose, Calif.

[21] Appl. No.: 523,448

[22] Filed: May 14, 1990

[51] Int. Cl.$^5$ .............................................. G06F 15/60
[52] U.S. Cl. ................................... 364/489; 364/488
[58] Field of Search ................ 364/488, 489, 490, 491

[56] References Cited

U.S. PATENT DOCUMENTS

| | | | |
|---|---|---|---|
| 4,703,435 | 10/1987 | Darringer et al. | 364/489 |
| 4,792,909 | 12/1988 | Serlet | 364/491 |
| 5,003,487 | 3/1991 | Drumm et al. | 364/489 |
| 5,005,136 | 4/1991 | Van Berkel et al. | 364/490 |
| 5,029,102 | 7/1991 | Drumm et al. | 364/489 |
| 5,041,986 | 8/1991 | Tanishita | 364/489 |
| 5,095,441 | 3/1992 | Hopper et al. | 364/489 |

OTHER PUBLICATIONS

"Multi-Level Logic Optimization and the Rectangular Covering Problem" Brayton et al., IEEE 1987, pp. 66–69.

"Dagon: Technology Binding and Local Optimization by DAG Matching", by K. Keutzer, 24th IEEE Design Automation Conf., 1987, pp. 341–347.

"A Rule-Based System for Optimizing Combinational Logic" by de Geus et al., 1985 IEEE Design and Test, pp. 22–32, Aug. 1985.

"MIS: A Multiple-Level Logic Optimization System" by Brayton et al., IEEE Trans. on Computer-Aided Design of Integrated Circuits and Systems, vol. CAD-6, No. 6, Nov. 1987, pp. 1062–1081.

Hwang et al., Proceedings of the 26th ACM-I.E.E.E. Design Automation Conference, Paper 15.1 (1989) pp. 215–220.

Brayton et al., Proceedings of ISCAS (May 1982) pp. 49–54.

*Primary Examiner*—Vincent N. Trans
*Attorney, Agent, or Firm*—Bowles Horton

[57] ABSTRACT

A method of automatic synthesis of a very large scale integrated circuit includes controlling the decomposition process in accordance with a reference order of inputs in a lexicographical expression of a Boolean function. The process improves the routability of the circuit by a reduction of complexity of wiring between cells of the circuit and external wiring to blocks connected to the synthesized circuit. The process also promotes an increase in speed and/or a decrease in area of the circuit, avoids ineffective decompostions which would be broken later during an optimization process and also helps to speed up the entire process of synthesis.

12 Claims, 5 Drawing Sheets

|   | A | B | C | D | E | F | G | L |
|---|---|---|---|---|---|---|---|---|
| A |   |   |   |   | 1 | 1 | 1 |   |
| B |   |   |   |   | 1 | 1 | 1 |   |
| C |   |   |   |   |   |   |   |   |
| D |   |   |   |   |   |   |   |   |
| E | 0 | 0 |   |   |   |   |   |   |
| F | 0 | 0 |   |   |   |   |   |   |
| G | 0 | 0 |   |   |   |   |   |   |
| L |   |   |   |   |   |   |   |   |

FIG. 4B

|   | A | B | C | D | E | F | G | L |
|---|---|---|---|---|---|---|---|---|
| A |   |   |   |   | 1 | 1 | 1 |   |
| B |   |   |   |   | 1 | 1 | 1 |   |
| C |   |   |   |   |   |   |   |   |
| D |   |   |   |   |   |   |   |   |
| E | 0 | 0 |   |   |   |   |   |   |
| F | 0 | 0 |   |   |   |   |   |   |
| G | 0 | 0 |   |   |   |   |   |   |
| L |   |   |   |   |   |   |   |   |

|   | A | B | C | D | E | F | G | L |
|---|---|---|---|---|---|---|---|---|
| A |   |   |   |   |   |   |   |   |
| B |   |   |   |   |   |   |   |   |
| C |   |   |   |   |   |   |   |   |
| D |   |   |   |   |   |   |   |   |
| E |   |   |   |   |   | 1 |   | 1 |
| F |   |   |   |   | 0 |   |   |   |
| G |   |   |   |   |   |   |   |   |
| L |   |   |   |   | 0 |   |   |   |

Pr (relation 2)

FIG. 4D

|   | A | B | C | D | E | F | G | L |
|---|---|---|---|---|---|---|---|---|
| A |   |   |   |   |   | 1 |   | 1 |
| B |   |   |   |   |   | 1 |   | 1 |
| C |   |   |   |   |   |   |   |   |
| D |   |   |   |   |   |   |   |   |
| E |   |   |   |   |   |   |   |   |
| F | 0 | 0 |   |   |   |   |   |   |
| G |   |   |   |   |   |   |   |   |
| L | 0 | 0 |   |   |   |   |   |   |

|   | A | B | C | D | E | F | G | L |
|---|---|---|---|---|---|---|---|---|
| A |   |   |   |   | 1 | 1 | 1 | 1 |
| B |   |   |   |   | 1 | 1 | 1 | 1 |
| C |   |   |   |   |   |   |   |   |
| D |   |   |   |   |   |   |   |   |
| E | 0 | 0 |   |   |   | 1 |   | 1 |
| F | 0 | 0 |   |   | 0 |   |   |   |
| G | 0 | 0 |   |   |   |   |   |   |
| L | 0 | 0 |   |   | 0 |   |   |   |

FIG. 5B

|   | A | B | C | D | E | F | G | L |
|---|---|---|---|---|---|---|---|---|
| A |   |   | 0 | 0 |   |   |   |   |
| B |   |   |   |   |   |   |   |   |
| C | 1 |   |   |   |   |   |   | 1 |
| D | 1 |   |   |   |   |   |   | 1 |
| E |   |   |   |   |   |   |   |   |
| F |   |   |   |   |   |   |   |   |
| G |   |   |   |   |   |   |   |   |
| L |   |   | 0 | 0 |   |   |   |   |

Pr (relation 3)

FIG. 5C

|   | A | B | C | D | E | F | G | L |
|---|---|---|---|---|---|---|---|---|
| A |   |   |   |   | 1 | 1 | 1 | 1 |
| B |   |   |   |   | 1 | 1 | 1 | 1 |
| C |   |   |   |   |   |   |   |   |
| D |   |   |   |   |   |   |   |   |
| E | 0 | 0 |   |   |   | 1 |   | 1 |
| F | 0 | 0 |   |   | 0 |   |   |   |
| G | 0 | 0 |   |   |   |   |   |   |
| L | 0 | 0 |   |   | 0 |   |   |   |

|   | A | B | C | D | E | F | G | L |
|---|---|---|---|---|---|---|---|---|
| A |   |   |   |   |   |   |   |   |
| B |   |   |   |   |   |   |   |   |
| C |   |   |   |   | 1 | 1 | 1 | 1 |
| D |   |   |   |   | 1 | 1 | 1 | 1 |
| E |   |   | 0 | 0 |   |   |   |   |
| F |   |   | 0 | 0 |   |   |   |   |
| G |   |   | 0 | 0 |   |   |   |   |
| L |   |   | 0 | 0 |   |   |   |   |

$\Delta Pr$

AUTOMATIC SYNTHESIS OF INTEGRATED CIRCUITS EMPLOYING CONTROLLED INPUT DEPENDENCY DURING A DECOMPOSITION PROCESS

BACKGROUND TO THE INVENTION

The present invention concerns the automatic synthesis of large scale integrated circuits (usually called "very large" scale integrated circuits) with the aid of a programmed machine, usually called a compiler, by means of which an operator initially specifies a complex digital processing function and achieves a detailed instruction for the layout of a very large scale integrated circuit which implements, in a selected technical realization (such as CMOS circuits) the complex function which has been specified by the operator. The design, checking and testing of such integrated circuits is so complex that the use of automatic synthesis using a programmed machine is essential for the task. This is partly because the digital signal processing functions are inherently complicated, partly because the main data processing functions need to be decomposed into simpler functions which are within the "library" of circuits to which the compiler has access, and partly because considerable computation is required in order to achieve an efficient layout of the network. It will be understood that the result of the computerised design process is a detailed specification defining, in terms of a particular technology, a complex integrated circuit.

Algorithms for use in automatic synthesizers and compilers are commercially known and are extensively described in the technical literature.

Automatic logic synthesis of very large scale integrated circuits requires several operations to transform a high level description into a physically realizable design. The process typically commences with the original functional statement of the circuit or processor which is to be synthesized and follows with the stages of minimization, factorization and mapping. The last mentioned stage is a synthesis in terms of the basic circuits or cells which are maintained for access in a cell library. Before this stage is implemented the circuit or processor which is to be synthesized is expressed in terms of logic, such as Boolean equations, in a manner which is independent of technology. Such a manner of expression does not express the logic in terms of particular circuits which are dependent upon the choice of fabrication. The mapping process converts the logical representation which is independent of technology into a form which is dependent on the selected technology and has recourse, as previously mentioned, to standard circuits or cells which are held within a cell library forming part of the data available to the compiler.

The original functional statement in terms of Boolean logic equations is normally very complex and is far from optimal in terms of area or delay.

Considerable attention has therefore been devoted in recent years to the development of algorithms for the minimization and decomposition of logical functions into multi-level logic which can more efficiently realise the desired function. Its final quality is measured in terms of area, delay or a compromise of these criteria.

SUMMARY OF THE PRIOR ART

Various methods are known for implementing combinational logic in optimal two level form using programmable logic arrays. However many logic blocks are inappropriate for this kind of implementation. Moreover even if a two level representation contains a reasonable number of terms, there are many examples in which a multi-level representation can be implemented with less area and generally as a much faster circuit. Optimal multi-level logic synthesis is a known and difficult problem which has been studied extensively over the last ten years. One development was the logic synthesis system which has, as a target technology, gate arrays and standard cells. Brayton et al in Proceedings ISCAS-85 (Kyoto) 1985 describe a silicon compiler which automatically synthesizes and lays out CMOS dynamic logic. Also known is the Socrates system, namely a multi-level logic synthesis system which uses gate arrays and standard cells and was one of the earliest to emphasize optimized timing performance. Such a system is described by de Geus et al, in IEEE Design and Test pages 22–32, August 1985.

In "MIS: A multiple level logic optimization system", by Brayton et al., in IEEE "Transactions on Computer Aided Design", Volume CAD-6, No. 6, November 1987, there is described a global optimization process which includes a variety of algorithms for the minimization, decomposition and timing optimization of multi-level logic functions. Reference should be made to the aforementioned paper for a general understanding of the basis of such optimization techniques.

Hwang et al., in an article entitled "Multi-level Logic Synthesis Using Communication Complexity", 26th ACM-IEEE Design Automation Conference, Paper 15.1, describe a multi-level logic synthesis technique in which inputs are partitioned in a manner which is intended to result in the fewest number of interconnections between sub-circuits.

It is presumed herein that the reader is familiar in general with the processes of automatic synthesis of very large scale integrated circuits and in particular with the programming of an automatic synthesizer which is provided with a high level statement of an electrical function and achieves a layout or netlist of the integrated circuit in a selected technology. The general state of the art is illustrated by, for example, Rabaey et al., "Cathedral -2: Computer Aided Synthesis of Digital Signal Processing Systems", Proceedings of the IEEE CICC 1987 pages 157–160 (1987), S. G. Smith and R. W. Morgan "High Level DSPASIC Design Tool", Proceedings Euro - ASIC 1989 pages 117–129, Grenoble, France, January 1989; Hartley et al., "A Digit Serial Silicon Compiler" Proceedings 25th ACM/IEEE DA Conference pages 646–649, Calif., June 1988; Proceedings of the 24th Design Automation Conference, Miami, Fla., June 1987; Proceedings of the International Workshop on Logic and Architectural Synthesis for Silicon Compilers, Grenoble, May 1988; Proceedings of the International Conference on Computer Aided Design, Santa Clara, Calif., November 1988; and IEEE Transactions on Computer Aided Design on Integrated Circuits and Systems, Volume CAD-5 Number 4, October 1986.

OBJECTS AND SUMMARY OF THE INVENTION

Classical Boolean decomposition methods are oriented on mathematical simplifications which are not directly related to minimization of the final area occupied by the large scale integrated circuit as implemented in the selected technology. In reality, these classical methods can miss their objectives by excessive factorization. Although they can lead to a minimization of the number of cells used to implement the function, the saving in area occupied by the cells is counterbalanced by the addition of area necessary for the connections between cells (hereinafter called routing area).

Hwang et al in the reference aforementioned pay some attention to this problem. The reference teaches a partitioning of the inputs recursively to reduce communication complexity. Unfortunately, the algorithm employed in the reference is restricted to functions which are hierarchically decomposable. These are functions such as adders, parity generators, and comparators. The algorithm does not deal with other topological considerations such as the connections with other circuits.

The main aim of the present invention is to provide a computer aided design process employing a multi-level synthesis method which aims at speeding up the performance and reducing the area occupied by a logic block by including routability considerations during the stage of decomposition of the Boolean function. The invention aims to control the input dependency during the multi-level synthesis process to achieve the following:

(1) a reduction in the final area required for the implementation of logic blocks by minimizing anarchical wiring and by considering topological constraints;
(2) speeding up the operation of the realized circuit by minimizing large fan-out and by taking into account arrival times on input signals; and
(3) improving the computational time required for the synthesis by avoiding complex and superfluous factorizations.

As will be explained in detail hereinafter, the invention is based on lexicographical expression of Boolean functions, controlling input dependency and on kernel filtering to control the excessive factorization that would otherwise be responsible for an increase in wiring complexity.

One preferred method according to the invention comprises providing at least one Boolean function relating the inputs and at least one output of a digital processor which is to be realized as an integrated circuit. The function is subjected to factorization to produce a factorized expression in which the order of precedence of the said inputs is compatible with a reference order of said input in a lexicographical expression of said at least one function and the circuit is realized in accordance with said factorized expression so that in said circuit said inputs enter in a physical order corresponding to said reference order.

In a particular implementation, the factorization step comprises extracting kernels from the function, examining precedence relations in factorizations associated with said kernels and cokernels thereof for compatibility with the said reference order and selecting factorizations that are found to be compatible.

The factorizations are preferably examined in an order of decreasing gain in terms of speed and/or area saved.

The examination of precedence relations preferably includes establishing for each factorization a precedence matrix in accordance with said lexicographical order, said matrix having N×N elements where N is the number of said inputs, the elements denoting in binary manner the precedence relation between the literals of any co-kernel associated with a respective kernel and the literals of the respective kernel; the examination also includes establishing for each successive factorization a current precedence matrix combining the precedence relation of that factorization and the precedence relations associated with all previous compatible factorizations.

The reference order may be predefined and in particular may be determined by one or or a compromise of the following criteria:

(i) performing the synthesis by taking into account interconnections of a logic block with other blocks;
(ii) predetermining the location of the inputs to improve utilization of area; and
(iii) predetermining the locations of input connectors such that relatively late inputs are disposed close to the output.

One advantage of the invention is that the preferred manner of factorization avoids factorizations liable to be broken during a subsequent optimization step; this speeds up the process of synthesis.

Further objects and features of the invention will be apparent from the detailed description that follows.

DETAILED DISCLOSURE

As indicated hereinbefore, the main object of the present invention is to provide, within a computer aided design process for the mapping of a very large scale integrated circuit, an improved synthesis of multi-level logic and in particular to improve the Boolean decomposition process in order to speed up, and minimize the area of, the final circuit.

Broadly, the present invention provides a novel decomposition strategy based on lexicographical expression of Boolean functions to control input dependency and on kernel filtering for controlling excessive factorizations which would otherwise be responsible for an increase in wiring complexity.

Automatic logic synthesis requires several operations to transform a high level description into a physically realizable logic design. As indicated hereinbefore, logic synthesis operations normally include minimization of Boolean equations, decomposition and technology mapping.

Minimization simplifies logic equations by finding an equivalent representation, normally at lower cost in terms of number of product terms and literals. Decomposition deals with the problem of finding components of Boolean equations that can be implemented once but used as often as required. Technology mapping determines how available logic cells (held within the library of the compiler) will be used to implement the decomposed equations. One example of a commercially available cell library is the VSC100 Portable 1.5-micron CMOS Standard Cell Library, Version 1.1 (1988) available from VLSI Technology Inc., San Jose, Calif.

DEFINITION OF TERMS

In order that the reader may more easily comprehend the discussion of the design process which follows, the following definition of terms is set out. This definition of terms generally follows that adopted in the references mentioned hereinbefore.

1. A "variable" is a symbol representing a single coordinate of the Boolean space. Examples of variables are a or b. In this description, the symbol ( ) is used to denote the negation of a variable.
2. A "literal" is a variable or its negation.
3. A "cube" or "product term" is a conjunction of literals. For example, ab is a cube but aa is not a cube.
4. An "expression" or "function" is a set of cubes. It represents a disjunction of its cubes. A function f may be defined as follows:

$f: Z^n$ implies $Z^m$ where $Z=[0,1]$; n represents the number of binary inputs and m represents the number of binary outputs.

5. For an expression or function f, ON(f) represents the ON-set of f, namely a set of cubes for which $f=1$. OFF(f) and DC(f) represent sets of cubes for which $f=0$ or f is "don't care" respectively.
6. An express ion is "irredundant" if no cube in the expression properly contains another.
7. A "Boolean expression" is an irredundant expression.
8. A "product implicant" of an expression (f) is a cube which does not contain any cube from OFF(f).
9. A "prime implicant" of f is an implicant which is not totally contained in any other implicant of f.
10. "Algebraic division" is the quotient of an expression f by another expression g. f/g is the largest set q of cubes such that $f=qg+r$ where q is the quotient and r is the remainder.
11. An expression is "cube free" if no cube divides the expression evenly.
12. The primary divisors of an expression f are the set of expressions $D(f)=[f/c$ where c is a cube].
13. The kernels of an expression f are the set of expressions $K(f)=[g \mid g \ E \ D(f)$ and g is cube free].
14. A cube c used to obtain the kernel $k=f/c$ is called a co-kernel of k and C(f) is used to denote the set of co-kernels of the expression f.

THE PROBLEM

As noted above, excessive routing factor, namely the ratio of wiring area to cell area, is a problem in complex logic implemented using standard cells. As the expressions become more complicated, the area devoted to the routing or wiring can be from twice to six times the area of the gates constituting the cells. This problem has increased even despite recent progress in multi-level optimization. This is partly due to excessive factorization. A common gate of small size shared between several functions implies an increase of wiring area greater than the area of the gates saved by the common use of the gate. This kind of factorization increases the fan-out of the gate (the multiplicity of outputs provided by the single gate). The effect of increase in fan-out is generally to reduce the speed of the entire circuit. A second reason for the problem of excessive routing is poor control of the dependency of the factorized expression on the inputs.

If no structuring of the Boolean networks implementing the synthesized function is afforded, a completely anarchical system of wiring follows. Then placement and routing tools, by which is meant programmed routines used by the compiler, will not be able to find a solution to the wiring problem without high channel congestion.

GENERAL DISCUSSION

The method proposed herein to solve the problem is to synthesize the Boolean functions in terms of "cones" with controlled input dependency. Preferably the intersections between these cones are controlled by means of filtering of common factors. Then the synthesis of the Boolean functions is performed using a given input ordering in order to structure the cones of logic. This is generally shown in FIG. 1.

Figure 1:
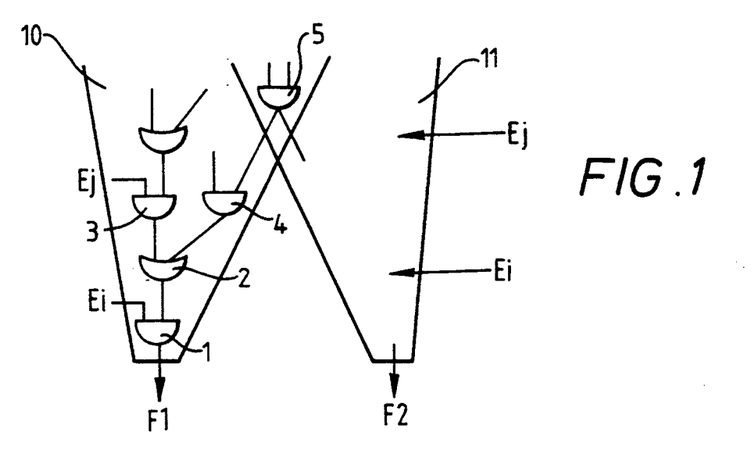
FIG. 1 illustrates schematically "logic cones" conceptually employed in the synthesis method.

FIG. 1 is a schematic representation of combinational circuit wherein the gates or cells 1,2,3,4 etc. are confined to regions 10 and 11 and the gate 5 is confined to the intersection of regions 10 and 11. Inputs Ei, Ej etc. are ordered to enter the regions laterally at different y-locations whereas outputs F1, F2 leave the narrow ends of the regions.

The area 10 (like area 11) constitutes a cone of logic. Such a cone defines a region, starting from a primary output and proceeding to the primary inputs, wherein if a gate belongs to this region all the predecessors of the gate also belong to the same region. The term 'cone of logic' closely relates to the complexity of the functional test of a digital circuit and is discussed by Eric Arcambeau in "Test Fonctionnel des Circuits Integres Digitaux"—Ph.D. dissertation, Institut National Polytechnique de Grenoble—21st Oct. 1985.

The ordering of the inputs can be achieved using two different approaches according to how the environment of the block of logic is specified. The input ordering may be chosen either in order to obtain substantially a maximum factorization compatible with the same lexicographical order or may be imposed by external wiring constraints. In the latter case, the lexicographical order is given at the beginning and the problem resolves itself into finding a compatible factorization.

Figure 2:
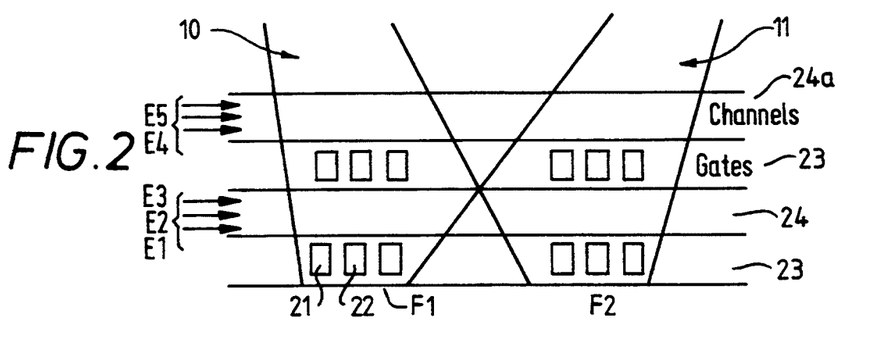
FIG. 2 schematically illustrates channels, gates and standard cells arranged according to the logic cone layout shown in FIG. 1.

FIG. 2 is a schematic diagram similar to FIG. 1 but showing the integrated circuit laid out with standard cells (21, 22 etc.) disposed within the regions 10, 11 and in laterally extending zones 23, etc. which alternate with zones 24. The latter zones, conveniently termed channels, are intended for the routing wiring and the connections from one logic block to another and are aligned with successive subsets of the inputs. The first subset E1, E2, E3 physically enter the circuit along the first channel 24, the second subset E4, E5 along channel 24a and so on.

External wiring constraints can be determined by timing considerations. As may be seen from FIG. 2, inputs E1, E2 and E3 have to cross a lesser area of the logic cones whereas inputs E4 and E5 have to cross over a greater area of the logic cones. Therefore, timing information on the external inputs may impose a lexicographical order. The external wiring may also impose a strict physical ordering of the inputs.

ALGEBRAIC APPROACH

The algebraic approach is intended to find an optimal expression of a set of functions with this structured dependency towards the inputs. Starting from irredundant sums of primes for each function, factorizations decreasing the number of literals in the set of functions are sought, but they must lead to structured cones. The following process, based upon lexicographical expressions of Boolean functions is proposed for the algebraic approach.

The term lexicographical expression of a Boolean function is used herein to denote a sum of product terms in which the literals respect the same order, called reference order, in each product term. For example, in the expression $$F = a\hat{c}b + \hat{a}bd + \hat{c}\hat{b}\hat{d} + \hat{d}ef$$

the reference order is {a c b d e f}.

It is apparent that the reference order is the order in which the terms in the expression first appear.

As used herein, a factorized lexicographical expression of a Boolean function is an expression which by flattening, namely executing the distributivity laws between the sums and products, leads to a lexicographical expression.

For example, one may consider the function:

$$F = \hat{e}ac + \hat{e}ft + \hat{e}fc + \hat{c}\hat{d}\hat{b} + \hat{a}cd + \hat{c}b$$

If the reference order is {e f a c d b} then factorization:

$$\hat{e}[ac + f(c+d)] + \ldots$$

is possible whereas a factorization:

$$\hat{c}[fe + a(e+d)] + \ldots$$

is not possible because the individual terms will appear in their order compatible with the reference order when the factorization is multiplied out in the first case but not in the second. Thus, eâc+efĉ+efd etc., is an expression in which all the terms appear within each product term in accordance with the reference order.

A tree corresponding to a lexicographical factorized expression of a Boolean function is a tree in which inputs enter in an ordered manner. This ordering is the reference ordering of the lexicographical expression. Accordingly, a lexicographical factorized Boolean expression is the algebraic target of this approach.

Figure 3:
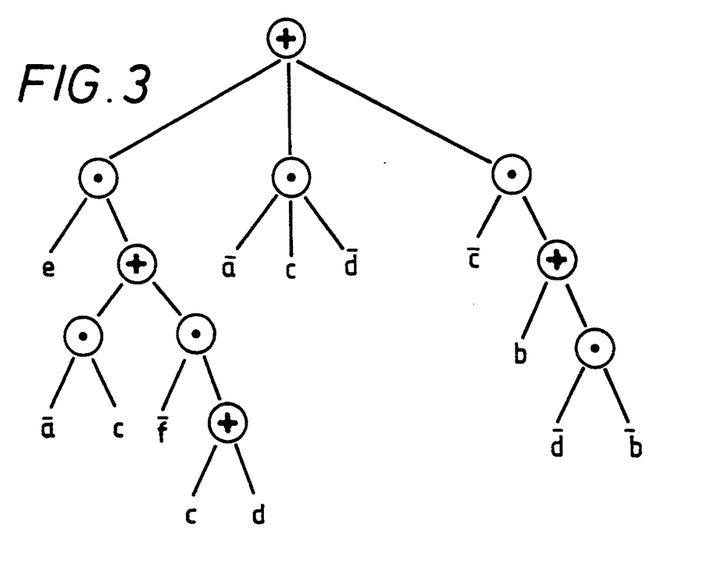
FIG. 3 illustrates a lexicographical factorized tree.

As an example, FIG. 3 shows a lexicographical factorized tree corresponding to the preceding function, factorized as $$F = \hat{e}[\hat{a}c + \hat{f}(c+d)] + \hat{a}c\hat{d} + \hat{c}(b + d\hat{b})$$

with the input ordering {e f a c d b}

ELEMENTARY FACTORIZATION AND ORDERING OF THE INPUT VARIABLES

The general idea presented herein is to select elementary factorizations leading to lexicographical expressions of the functions.

An elementary factorization based on a kernel and cokernels extraction induces a precedence relation stating that the literals of the cokernels precede the literals of the kernel.

Thus for example the factorization $\hat{c}(b + \hat{d}\hat{b})$ connotes that (c) precedes (db). This is denoted herein by c→(db).

It will be apparent that this is related to the logic tree shown in FIG. 3 in which the input c enters the logic cone before either input d or b.

In a classical factorization process several cokernels may be attached to the kernel. These cokernels may concern factorization within a function or between several functions. The precedence relation is applied to the union of the set of variables of the cokernels.

Consider the following two functions:

$$F1 = ac + ade + bc + bde$$

and $$F2 = afg + bfg + efg.$$

The elementary factorizations and the associated precedence relations are listed below:

(c) (de) (fg) [a+b]; (cdefg)→(ab);

(a) (b) [c+de]; (ab)→cde; and (fg) [a+b+e]; (fg)→abe.

It will be apparent later that it is possible to choose a subset of the factorizations concerning a kernel. This allows a weaker precedence relation. In the previous examples, if c could not precede a and b owing to earlier constraints, one could still use the factorization (de)(fg) [a+b] and the relation (defg)→(ab).

One may mention that a common cube between functions does not imply a precedence relation.

An elementary factorization is compatible with a reference order if the precedence relation induced between the literals is respected in the reference order. Thus in the expression:

$$F = c\hat{a}d + \hat{a}c + c\hat{d} + \hat{d}\hat{b} + b\hat{a}d$$

the factorization $\hat{b}a$ (c+d) is compatible with the reference order [b a c d] or the order [b a d c].

Two elementary factorizations are compatible if there exists a reference order which is compatible with both of them.

The general problem here is to find an optimal set of compatible factorizations. By this is meant a set of compatible factorizations allowing the reduction of a maximum number of literals. Because this compatibility relation is not transitive a global and classical approach looking for maximal compatibility classes is not feasible. Therefore one may postulate a "greedy" algorithm which considers the factorizations in a decreasing order of gain.

AN ALGORITHM FOR THE SELECTION OF A SET OF COMPATIBLE FACTORIZATIONS

Initially, a kernel extraction phase may be performed to provide a list of kernels and cokernels ranked in an order of decreasing gain. The 'gain' is the maximal gain of area or time (as selected by the designer) saved by factorizations, related to all cokernels. With each kernel are associated the precedence relations between input literals. To facilitate notation it is convenient in this section to refer to variables and not literals. Starting from the factorization which provides the greatest gain a next compatible factorization will be chosen.

A compatible factorization does not violate any input ordering of the previously chosen factorizations. To discover whether a factorization is compatible with the previous factorizations, one may develop (as part of the automated design process) a current precedence matrix which will update all the precedence relations between variables. If $N_i$ is the number of input variables, the precedence matrix associated with an elementary precedence relation R: B→B is an $N_i \times N_i$ matrix, denoted herein Pr ($R_i$) in which the element (i,j) is 1 1 if $x_i$ precedes $x_j$ and 0 if $x_j$ precedes $x_i$ in R. All the other elements are "don't care". Two matrices are incompatible if $x_i$ precedes $x_j$ (or vice versa) in one matrix and the reverse is true in the other matrix. The current precedence matrix (denoted $Pr_c$) contains the information about all updated precedence relations.

The current precedence matrix $Pr_c$ is antisymmetric. Suppose that at step i the current precedence matrix is $Pr_c$ and that a new relation R is chosen. The updating of the precedence relation leads to consideration of the following new precedence relations expressed in the matrix:

$$\delta Pr_c = Pr_c \text{(step } i) \times Pr(R) + Pr(R) \times Pr_c \text{(step } i). \quad [1]$$

The matrix multiplication is based on the following rules:

$0*0=0$
$1*1=1$
$X*(-)=(-)$
$(-)*X=(-)$ where $X=[0,1]$.

This incrementation procedure of the precedence relations when adding a relation states that any ancestor of an element of B in the current state inherits new successors which are the elements of B and similarly the elements of B inherit new ancestors which are the ancestors of any other element.

In fact, owing to the antisymmetry of the matrix, this computation is redundant and it is sufficient to perform the operation $$\delta Pr = \{Pr_c(\text{step } i) \times Pr(R)\}^* \quad [2]$$

where the sign (*) signifies completion by asymmetry. Thus as soon as the element (i,j) in the product matrix takes the value 1 or 0 the element (j,i) takes the complementary value.

The current updated precedence matrix thus becomes $$Pr_c(\text{step } i+i) = Pr_c(\text{step } i) + Pr(R) + \delta Pr_c \quad [3]$$

To test that the new relation is compatible with the previous ones it is sufficient to verify that the new relation would not introduce inconsistencies in the current precedence matrix.

The sum term can be suppressed if the matrices $Pr_c$ and $Pr(R)$ are extended to $Pr'_c$ and $Pr'(R)$ where a matrix $Pr'$ is obtained from a matrix Pr by adding the diagonal matrix.

The final relation is then:

$$Pr'_c(\text{step } i+1) = [Pr'_c(\text{step } i) \times Pr'(R)]^* \quad [4]$$

To illustrate this, consider three precedence relations corresponding to three elementary factorizations ranked in a decreasing gain ordering where $N_i=8$ and the inputs are [A, B, C, D, E, F, G, L].

(1) (AB)→EFG
(2) E→FL
(3) CD→AL

In a second step, the second relation is chosen. The precedence refinement produced by the new relation is given by:

$$\delta Pr = [Pr_c \times Pr(\text{relation 2})]^*$$

Figure 4A:
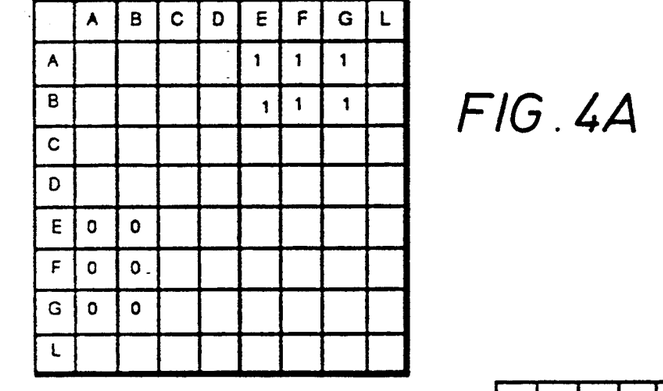
FIGS. 4A to 4D and 5A to 5E illustrate various precedence matrixes relevant to the ordering of inputs.
Figures 4B, 4C, 4D:
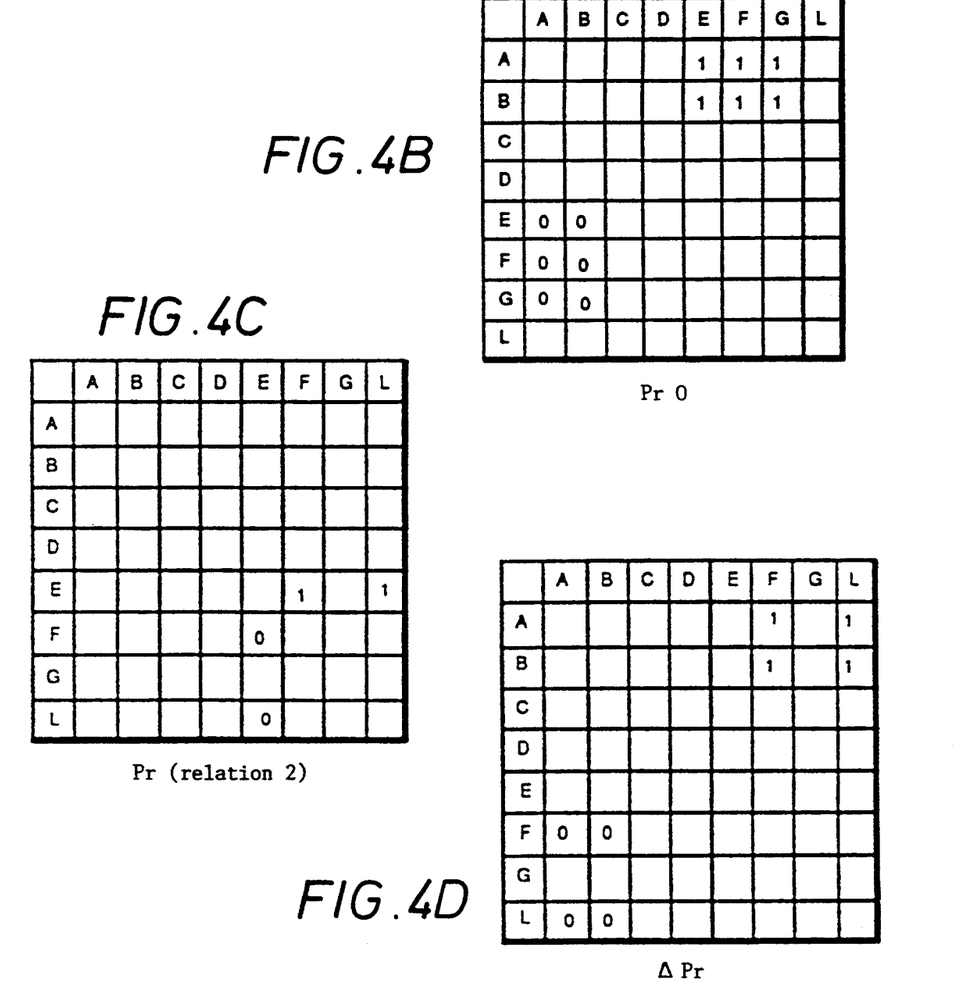
Figure 5A:
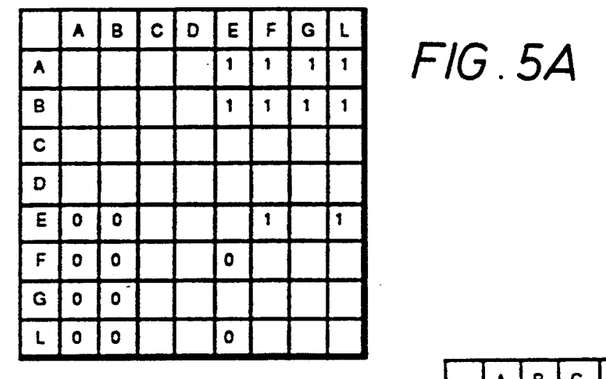

FIGS. 4B, 4C and 4D illustrate the initial Pr, Pr (relation 2) and δPr respectively. The current precedence matrix is shown in FIG. 5A.

Figure 5B:
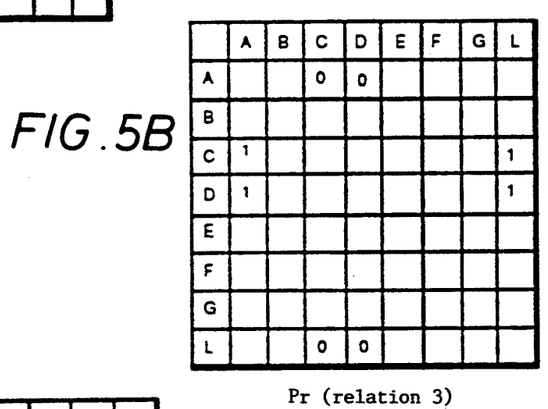
Figures 5C, 5D:
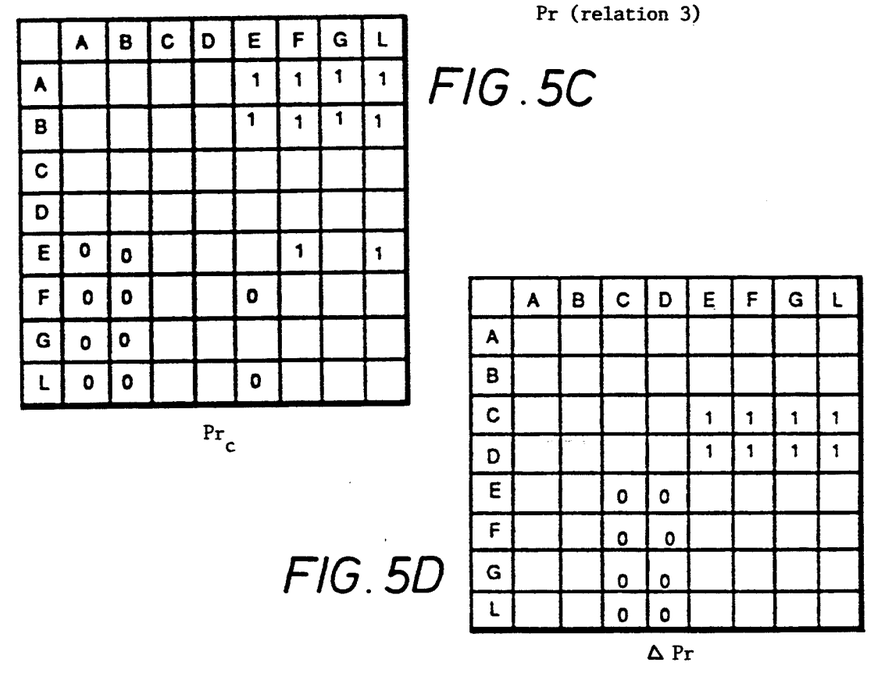
Figure 5E:
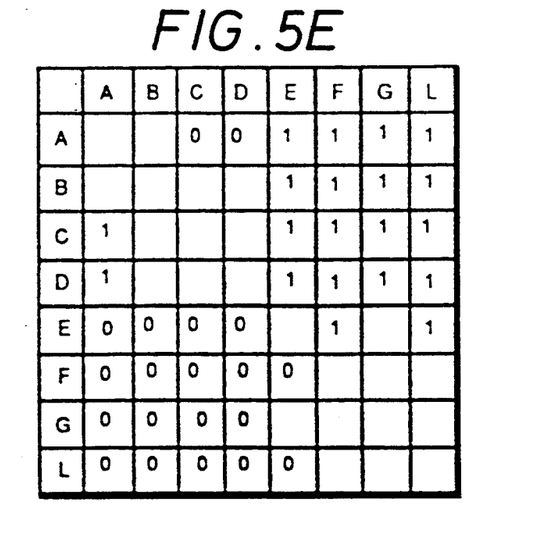

Similarly, the influence of the third relation, for which the precedence matrix is shown in FIG. 5B, leads to a further updating of the precedence relation:

$$\delta Pr_c = [Pr_c \times Pr(\text{relation 3})]$$

where $Pr_c$ is shown in FIG. 5B, δPr is shown in FIG. 5C and the final precedence matrix is shown in FIG. 5D.

Provided that the updating of the precedence matrix is feasible the factorization is considered as accepted and the procedure provides a set of compatible factorizations.

The Boolean decomposition process based on the controlled input dependency may proceed in two different ways according to the environment of the logic block to be synthesized.

Figure 6:
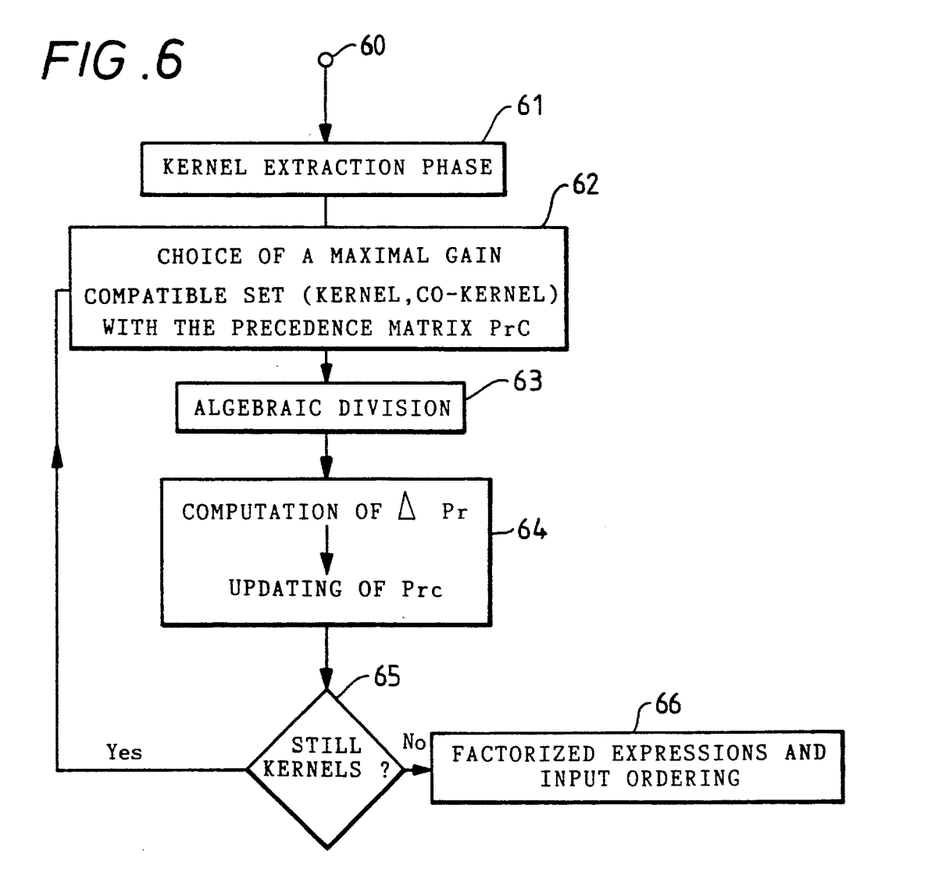
FIG. 6 illustrates the schematic of a synthesis method according to the invention.

If the environment is not specified then the decomposition process will be performed without initial topological constraints. The input ordering will be built step by step during the synthesis in order to optimize the wiring. This process is shown in FIG. 6 in terms of program segments illustrated as blocks. Input 60 denotes an initial Boolean expression of the function to be synthesized. Block 61 denotes the extraction of kernels. Block 62 denotes the development of a compatible set of factorizations providing maximal gain. For each factorization there follows an algebraic division (block 63), a computation (block 64) of δPr and updating of the current precedence matrix. The process is continued (block 65) until no kernels remain, the result being the ordering (block 66) of the inputs to the integrated circuit in accordance with the lexicographical expression of the Boolean function and the required factorized expressions.

Figure 7:
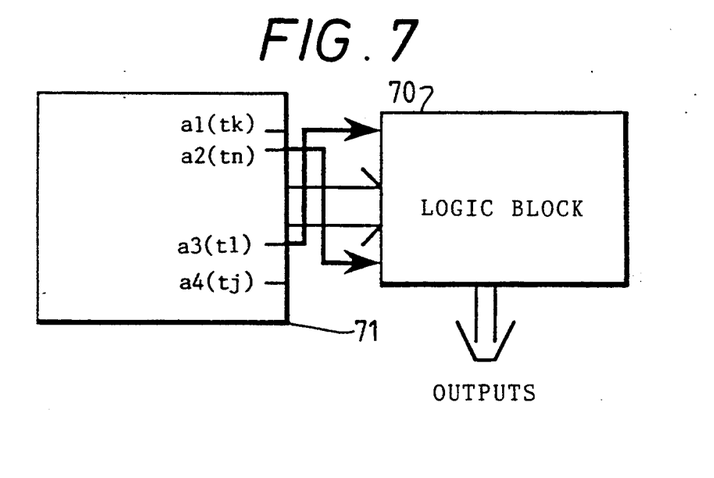
FIG. 7 illustrates the ordering of inputs to a logic block.

There may, however be topological constraints imposed on the process. For example, the inputs may be ordered according to their arrival times. FIG. 7 illustrates generally such an example. In the Figure, the block 70 represents the logic block which is to be synthesized. Block 71 represents a pre-existing logic block to which block 70 is to be connected. Block 71 provides output signals a1, a2, a3 and a4 having different arrival times at block 70. If, as shown signal a3 has an arrival time earlier than signal a2, then the input signals to block 70 may be ordered so that signal a2 and other relatively late signals are placed at the top of the logic tree whereas signal a3 and other relatively early signals are placed nearer the bottom, i.e. the output end, of the logic tree.

Figure 8:
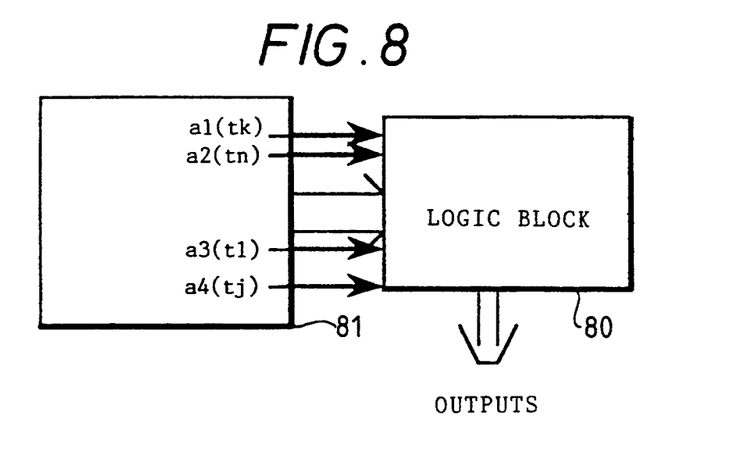
FIG. 8 illustrates another arrangement for the ordering of inputs to the logic block.

Alternatively, if minimization of area is required, the input ordering will be determined by the locations of the outputs a1, a2 etc. from the adjacent pre-existing or pre-defined block. This is illustrated in FIG. 8 wherein block 80 represents the logic block to be synthesized and block 81 represents the pre-defined adjacent block having outputs a1, a2 etc. at pre-defined physical locations. The positional order of the corresponding inputs to block 80 is then the predefined order of the inputs in the automatic synthesis of block 80.

Figure 9:
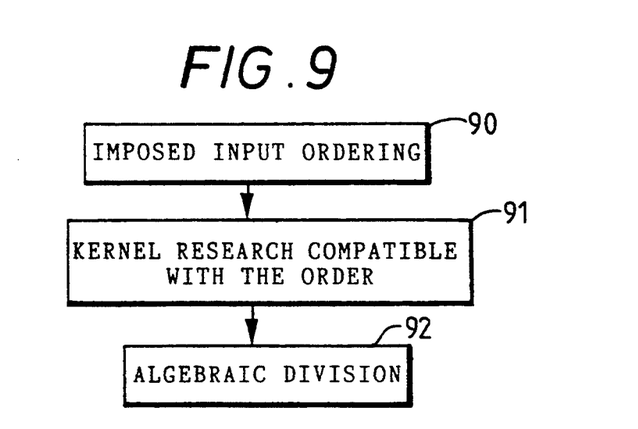
FIG. 9 illustrates a simplified schematic of one method according to the invention.

FIG. 9 summarises the process of synthesis when the order of the inputs is imposed, as represented by block 90. Then the process described above becomes a search (block 91) for kernels compatible with the imposed reference order of the inputs. When those kernels have been found the Boolean expressions may be divided (block 92) to provide a factored expression which is, as before, compatible with the (imposed) lexicographical order.

Those skilled in the art will understand that the foregoing description is by way of example only and that many variations are feasible within the spirit and scope of the claims that follow.

We claim:

1. A method of automatic synthesis and physical realization of an integrated circuit having a multiplicity of inputs and at least one output, comprising the steps of:
   (i) providing at least one Boolean function relating a multiplicity of inputs and at least one output of an integrated circuit;
   (ii) performing by means of a programmed computer factorization of said at least one function to produce a factorized expression in which the order of precedence of said inputs is compatible with a reference order of said inputs in a lexicographical expression of said at least one function; and
   (iii) making said integrated circuit in accordance with said factorized expression whereby in said integrated circuit said inputs enter in a physical order corresponding to said reference order.

2. A method as set forth in claim 1 wherein said factorization step comprises:
   extracting kernels from said at least one function;
   examining precedence relations in factorizations associated with said kernels and co-kernels thereof for compatibility with the said reference order; and
   selecting factorizations that are found to be compatible by means of the examining step.

3. A method as set forth in claim 2 wherein said step of examining includes:
   examining factorizations in an order of decreasing gain in terms of speed and/or area saved.

4. A method as set forth in claim 3 wherein the step of examining precedence relations includes establishing for each factorization a precedence matrix in accordance with said lexicographical order, said matrix having $N \times N$ elements where N is the number of said inputs, the elements denoting in binary manner the precedence relation between the literals of any co-kernel associated with a respective kernel and the literals of the respective kernel.

5. A method as set forth in claim 4 wherein said step of examining precedence relations includes establishing for each successive factorization a current precedence matrix combining the precedence relation of that factorization and the precedence relations associated with all previous compatible factorizations.

6. A method as set forth in claim 1 further comprising predefining the said lexicographical order.

7. A method of automatic synthesis and physical realization of an integrated circuit for the performance of at least one predefined function relating a multiplicity of inputs to at least one output, comprising the steps of:
   (i) providing Boolean functions representing at least one predefined function;
   (ii) performing by means of a programmed computer:
      (a) extracting from said at least one function a plurality of kernels and associated co-kernels;
      (b) establishing for each kernel whether the order of precedence of the literals of the said at least one co-kernel and the literals of the kernel is compatible with a reference order in a lexicographical expression of said Boolean functions; and
      (c) factorizing the expression into a factorization in accordance with kernels for which the said order of precedence is compatible with said reference order;
   and
   (iii) making an integrated circuit in accordance with said factorization, said integrated circuit having a multiplicity of inputs in a physical order corresponding to said reference order.

8. A method as set forth in claim 7 wherein the step of establishing comprises establishing a precedence matrix in accordance with the said lexicographical order, said matrix having elements denoting the precedence relation between the literals of any co-kernel associated with a respective kernel and the literals of the respective kernel.

9. A method as set forth in claim 8 further comprising establishing a current precedence matrix representing the precedence relations of a set of compatible factorizations of the Boolean functions.

10. A method as set forth in claim 9 further comprising predefining the said reference order.

11. A method as set forth in claim 10 wherein the step of predefining the reference order is performed by at least one of:
    (i) performing the synthesis by taking into account interconnections of a logic block with other blocks;
    (ii) predetermining the location of the inputs to improve utilization of area; and
    (iii) predetermining the locations of input connectors such that relatively late inputs are disposed close to the output.

12. A method according to claim 7 wherein the step of factorization avoids factorizations liable to be broken during a subsequent optimization step, whereby to speed up the process of synthesis.

* * * * *